(12) United States Patent
Cheng

(10) Patent No.: US 7,962,801 B2
(45) Date of Patent: Jun. 14, 2011

(54) LINK TABLE RECOVERY METHOD

(75) Inventor: Chia-Hsin Cheng, Taichung (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 293 days.

(21) Appl. No.: 12/251,810

(22) Filed: Oct. 15, 2008

(65) Prior Publication Data

US 2010/0095148 A1    Apr. 15, 2010

(51) Int. Cl.
*G06F 11/00* (2006.01)
(52) U.S. Cl. .............................................. 714/42; 714/6
(58) Field of Classification Search .................. None
See application file for complete search history.

(56) References Cited

U.S. PATENT DOCUMENTS

| | | | |
|---|---|---|---|
| 5,745,912 A * | 4/1998 | Konishi et al. | 713/600 |
| 6,742,078 B1 * | 5/2004 | Chien et al. | 711/103 |
| 7,761,740 B2 * | 7/2010 | Kern et al. | 714/15 |
| 2003/0145141 A1 * | 7/2003 | Chen et al. | 710/74 |
| 2005/0144516 A1 * | 6/2005 | Gonzalez et al. | 714/8 |
| 2007/0083697 A1 * | 4/2007 | Birrell et al. | 711/103 |
| 2009/0172466 A1 * | 7/2009 | Royer et al. | 714/6 |
| 2009/0307413 A1 * | 12/2009 | Chu | 711/103 |

* cited by examiner

*Primary Examiner* — Michael C Maskulinski
(74) *Attorney, Agent, or Firm* — Thomas/Kayden

(57) ABSTRACT

A link table recovery method for a flash memory having a plurality of blocks is provided. The method includes: selecting one block from the blocks; selecting a last page containing data of the selected block; checking the last page to determine whether the last page has errors; moving the correct data in the selected block to one of the spare blocks when the last page of the selected block detects errors; and updating a link table of the flash memory.

18 Claims, 6 Drawing Sheets

| RAM Address | RAM Content |
|---|---|
| L.B. Address 0x00 | P.B. Address N |
| L.B. Address 0x01 | P.B. Address S |
| L.B. Address 0x02 | P.B. Address T |
| ..... | ..... |
| L.B. Address 0x0Z | P.B. Address I |

FIG. 4

LINK TABLE RECOVERY METHOD

BACKGROUND OF THE INVENTION

1. Field of the Invention

The invention relates to a link table recovery method, and more particularly to a link table recovery method after sudden power failure.

2. Description of the Related Art

Flash memory is a non-volatile memory that can be electrically erased and reprogrammed. Flash memories are primarily used in memory cards and USB flash drives for general storage and transfer of data between computers and other digital products. Flash memory costs far less than EEPROM and therefore has become a dominant memory device. Examples of flash memory applications include applications in Personal Digital Assistants (PDA) and laptop computers, digital audio players, digital cameras and mobile phones.

Generally speaking, flash memory is controlled by a flash controller. However, if power failure occurs while the flash controller is performing an access operation, for example in the middle of writing data to the flash memory, the contents of the interrupted page or block become unreadable after the flash memory has been powered up again and may be random. This is because, while some of the affected bits in the flash memory may have reached the state assigned to them by the flash memory operation by the time of the power interruption, remaining affected bits in the flash memory may have not. Thus, there is a need for an improved flash management system, capable of dealing with flash memory power interruptions.

BRIEF SUMMARY OF THE INVENTION

An embodiment of a link table recovery method for a flash memory having a plurality of blocks is disclosed. The method comprises: selecting one block from the blocks; selecting a last page containing data of the selected block; checking the last page to determine whether the last page has errors; moving the correct data in the selected block to one of the spare blocks when the last page of the selected block detects errors; and updating a link table of the flash memory.

An embodiment of the link table recovery method for a flash memory comprising a plurality of blocks after sudden power failure is provided. The method comprises: selecting a last accessed block; checking pages of the last accessed block to determine whether the last accessed block has errors; moving correct data from the last accessed block to a spare block when detecting error in a first page; and updating a link table of the flash memory.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 4 is an embodiment of the link table block according to the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
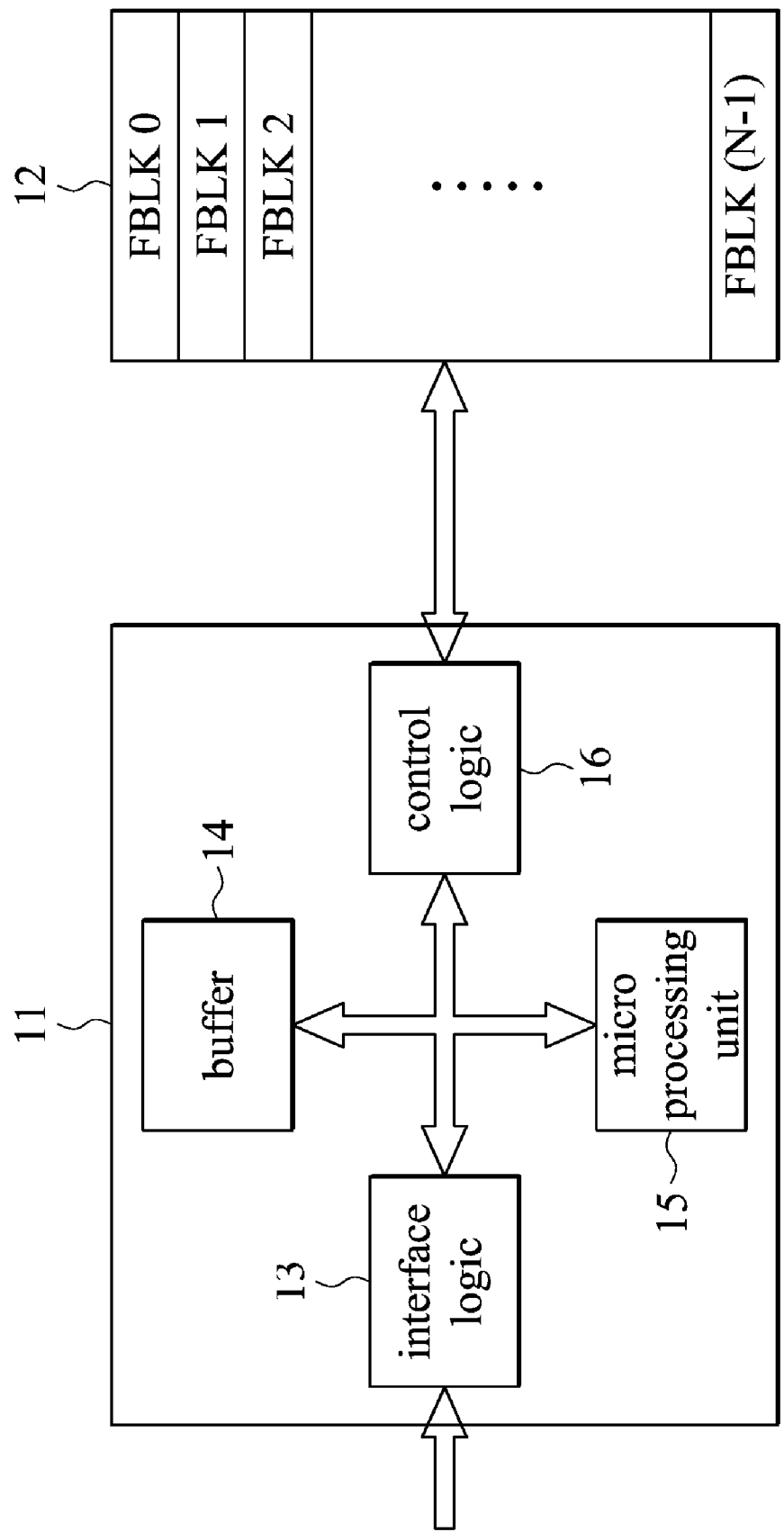
FIG. 1 is a block diagram of a flash memory device.

FIG. 1 is a block diagram of a flash memory device. The flash memory device 10 comprises a memory controller 11, and a non-volatile flash memory 12. The memory controller 11 comprises interface logic 13, a volatile buffer 14, control logic 16 and microprocessor 15, wherein the interface logic 13 transmits data to/from a host (not shown in FIG. 1), the volatile buffer 14 is used to temporality store data written in or read from the non-volatile flash memory 12. The logic elements 13, 14, and 16 are controlled by the microprocessor 15. The non-volatile flash memory 12 comprises a plurality of blocks and data can be over-written to the blocks only after the blocks are erased. In other words, the data can only be written to the empty blocks.

Figure 2:
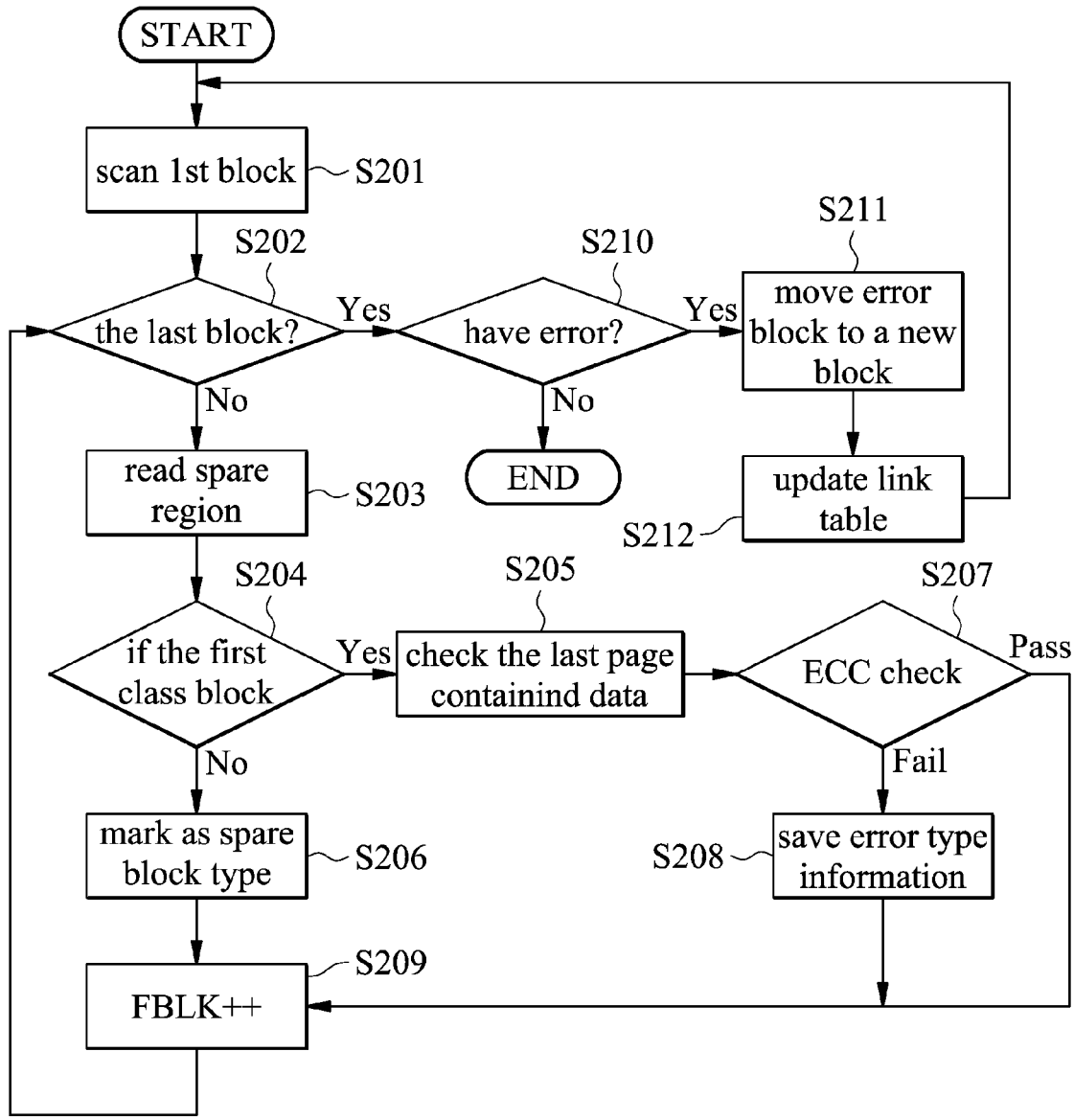
FIG. 2 is a flow chart of an embodiment of a link table recovery method for a flash memory according to the invention.
Figure 3:
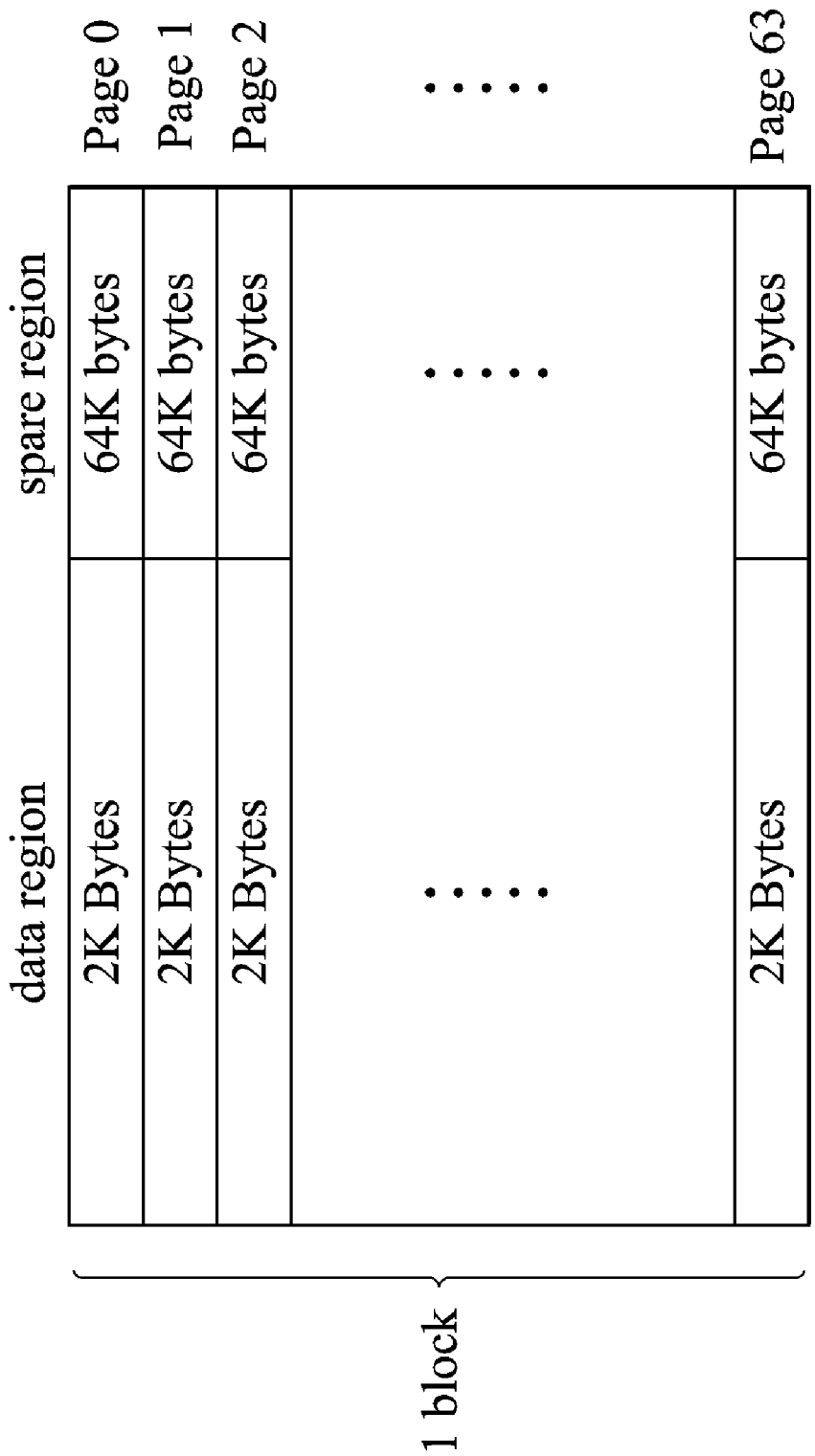
FIG. 3 shows the structure of a block according to an embodiment of the invention.

FIG. 2 is a flow chart of an embodiment of a link table recovery method for a flash memory according to the invention. The method especially focuses on the link table recovery method after the sudden power failure while the flash memory is being programmed. It is noted that only one block of the flash memory may fail when the sudden power failure occurs during the programming of the flash memory, but sometimes the ECC error may also occur on the adjacent pages. The flash memory comprises a plurality of blocks and each block comprises a plurality pages. In step S201, the flash memory controller selects the first block of the flash memory. In the step S202, the controller determines whether the selected block is the last block. If yes, the method goes to step S210. If not, the method goes to step S203. In step S203, the controller reads the spare regions of the selected block to determine the type of the selected block. The block comprises a plurality of pages and each page contains a spare region. The spare region contains ECC (error checking and correction) parity, firmware parameters and identification (ID) of the selected block. Please refer to FIG. 3. FIG. 3 shows the structure of a block according to an embodiment of the invention. In this embodiment, the block comprises 64 pages and each page comprises a data region and a spare region. The spare is also called the overhead data to store some parameters associated with the blocks. The structure of FIG. 3 is only for illustration, and the structure may vary based on the standard of different types of flash memories.

In step S203, the controller determines whether the selected block is the first class block based on the ID stored in the spare region. The first class block is a kind of data block for storing user data, for example, may be the FAT (file allocation table) block, mother block, child block, or temp block. If the selected block belongs to the first class block, the controller executes the step S205. If the selected block does not belong to the first class block, the controller executes the step S206 to mark the selected block as the spare block and go to step S209 after step S206. In step S205, the controller searches and checks the last page containing data. In this embodiment, the controller searches the last page containing data for the ECC check because only one page may contain error while the sudden power failure occurs. In another embodiment, the controller can check a plurality of pages near the selected page or all the pages of the selected block. In step S207, the controller executes an ECC check on the selected page. The controller reads the user data and the ECC related data stored in the spare region and verifies the user data based on the ECC related data. If the select page passes, the method goes to the step S209. If the selected page fails to verification, the controller executes the step S208 to store the error type information of the selected pages. The error type information comprises the physical address of the selected block and the page number of the error page.

After saving the error type information, the method goes to step S209 to select another block for check. In this embodiment, the blocks are sequentially selected, but the invention is not limited thereto. When the selected block is the last block, the method goes to the step S210 to check whether the last block has an error. If the last block does not have an error, the controller further determines whether the previous blocks have an error. If all the blocks do not have error, the method finishes. If any block contains an error, the controller moves the correct data of the error block to a new block, for example the spare block, in step S211, wherein the correct data of the error block is the data stored in the pages previous to the error page. After the step S211, the controller updates the link table in step S212. When accessing one MU (management unit) of the flash memory, the corresponding link table is acquired and stored in RAM. The controller accesses and modifies the link table from the RAM and stores the modified link table to the RAM and the MU. After the step S212, the controller repeats the method again and rebuilds the link table. As to the link table, please refer to FIG. 4.

FIG. 4 is an embodiment of the link table block according to the invention. The link table is used for logical addresses and the flash memory controller manages the flash memory by physical addresses. The link table acts as a look-up table to ensure the controller correctly translates logical addresses into physical addresses. In other words, the link table ensures data correctness by interchanging of the logical address used for the controller and the actual address of the block in the flash memory. In FIG. 4, the RAM address represents the logic address and the content of RAM address stores the corresponding physical address of the block. For example, the RAM address 0x00, i.e., the logic block address (shown as L.B. Address 0x00) stores the physical block address N, and when the flash memory controller accesses the block of the logic block address 0x00, the flash memory controller actually accesses the block of the physical address N. In the step S212 of FIG. 2, the controller changes the RAM content to update the link table. For example, the block of the logic block address 0x0Z is the spare block and the block of the logic block address 0x02 is the error block. The controller moves the correct data of the error block to the spare block and exchanges the RAM content of the logic block address 0x02 with the content of the logic block address 0x0Z. Next, when the controller accesses the logic block address 0x02, the controller actually accesses the block of the physical address I, not the block of the physical address T.

Figure 5:
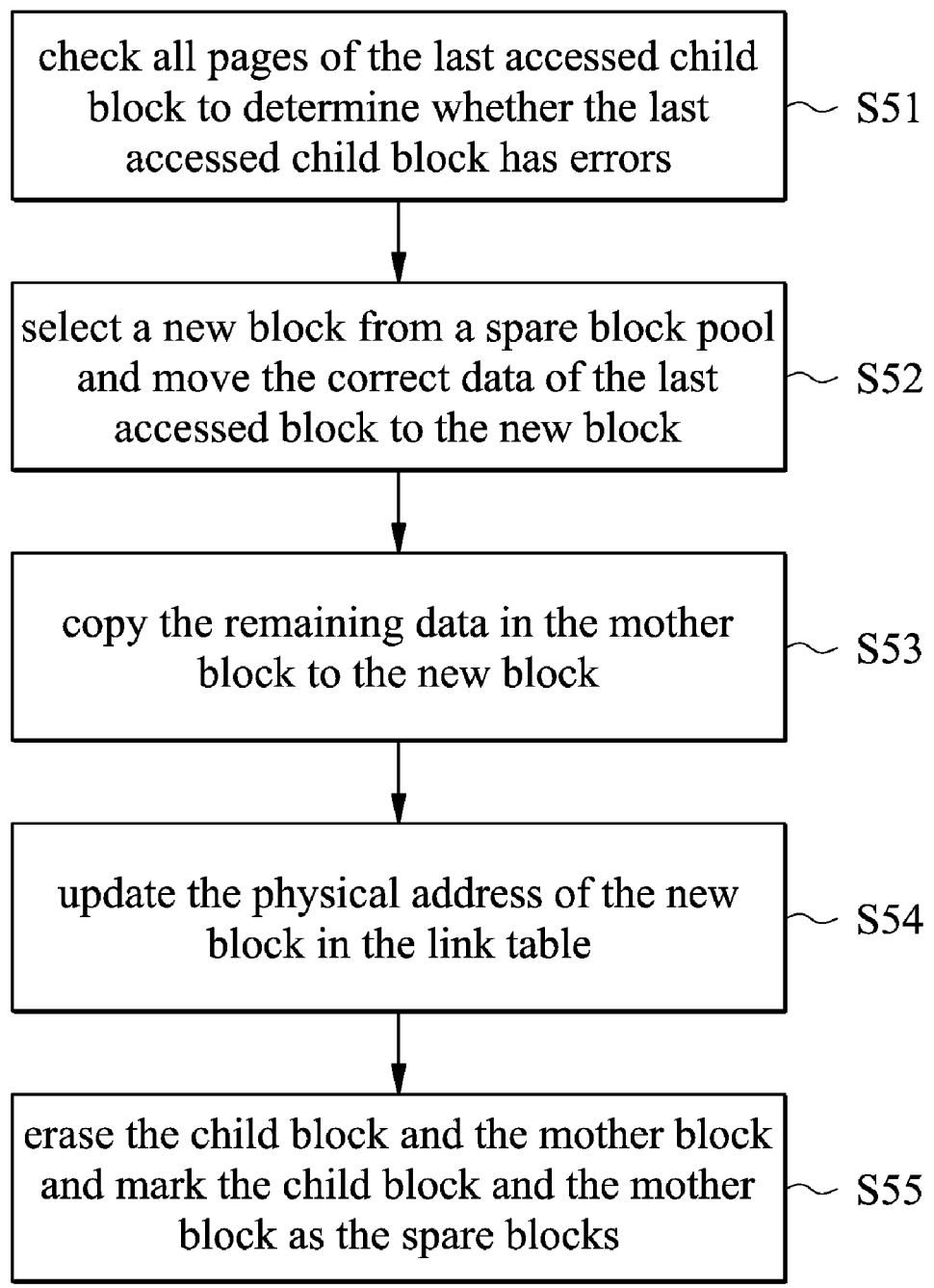
FIG. 5 is a flow chart of another embodiment of a link table recovery method for a flash memory according to the invention.

FIG. 5 is a flow chart of another embodiment of a link table recovery method for a flash memory according to the invention. In step S51, the controller checks all pages of the last accessed child block to determine whether the last accessed child block has errors. The embodiment of FIG. 5 is illustrated with the child block, but is not limited thereto. The link table recovery method shown in FIG. 5, can also be used for the temp block, FAT block, child-to-FAT block or other block type. If the last accessed child block does not have errors, the link table recovery method finishes or checks the blocks adjacent to the last accessed child block. If the last accessed child bock has errors, the method goes to step S52. In step S52, the controller selects a new block from a spare block pool and moves the correct data of the last accessed block to the new block, wherein the correct data is the data stored in the pages previous to the error page of the error child block. In the step S53, the controller copies the remaining data in the mother block to the new block. For example, if the mother block and the child block have 1024 pages, and the controller error is found in the $100^{th}$ page of the child block, the controller first move the data from the $1^{st}$ page to the $99^{th}$ page of the child block to the new block, and then copies the data from the $100^{th}$ to the $1024^{th}$ page of the mother block to the corresponding pages of the new block. In the step S54, the controller updates the physical address of the new block in the link table. The updating is similar to the updating described previously. In the step S55, the controller erases the child block and the mother block and marks the child block and the mother block as the spare blocks.

Figure 6:
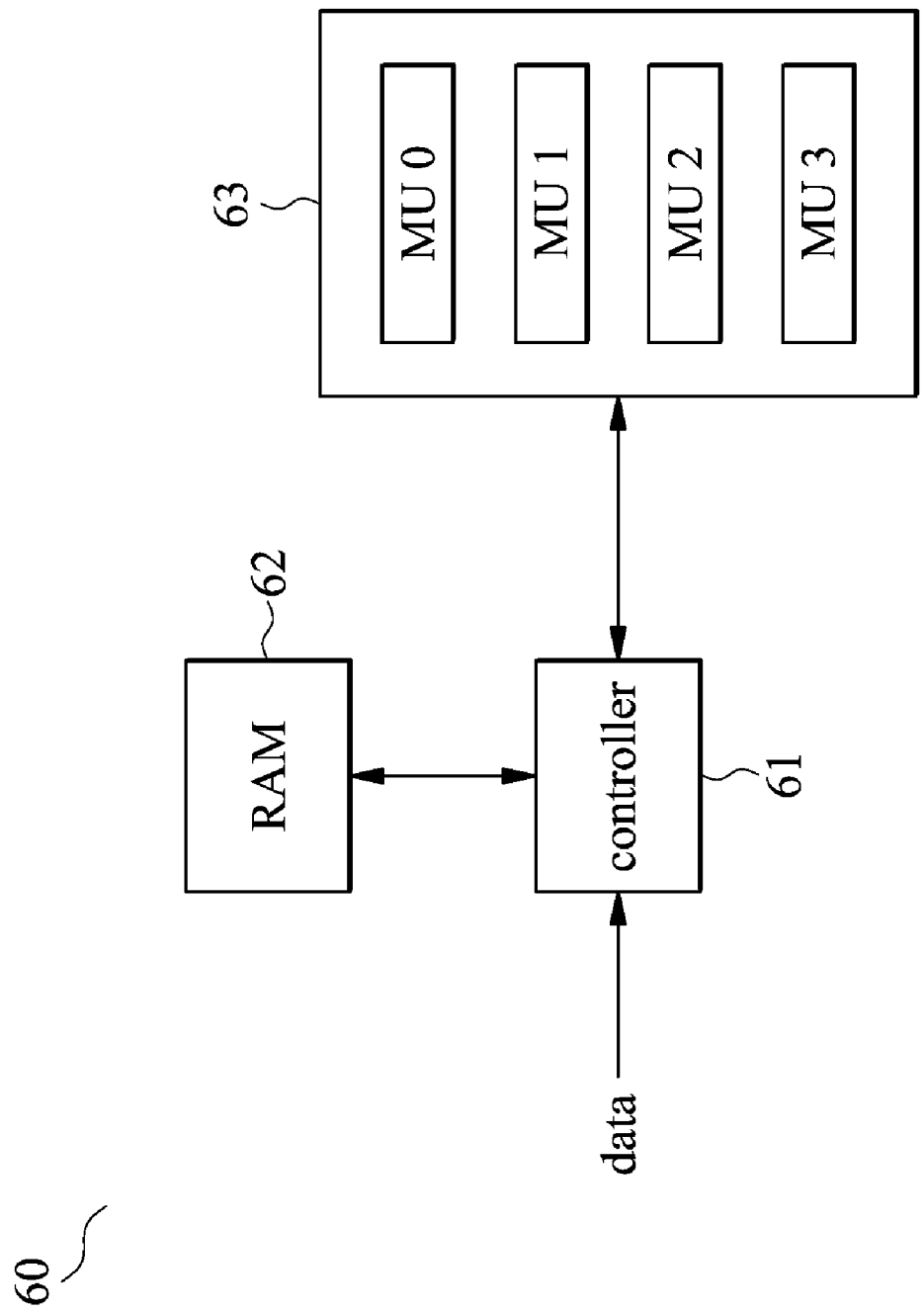
FIG. 6 is a block diagram of an embodiment of the flash memory system according to the invention.

FIG. 6 is a block diagram of an embodiment of the flash memory system according to the invention. The flash memory system 60 comprises RAM 62, controller 61 and flash memory 63. The controller 61 receives and writes data to the flash memory 63 based on the corresponding link table stored in RAM 62. When the controller 61 accesses the MU of the flash memory 63, such as the MU0, the controller 61 acquires and stores the corresponding link table to the RAM 62. When the controller 61 accesses the flash memory 63 and the sudden power failure occurs, the controller 61 executes a link table recovery method, such as that shown in FIG. 2 and FIG. 5, to ensure that the flash memory 63 can be normally accessed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A link table recovery method for a flash memory comprising a plurality of blocks, comprising:
   selecting one block from the blocks;
   selecting a last page containing data of the selected block;
   checking the last page to determine whether the last page has errors;
   moving correct data in the selected block to one of spare blocks when the last page of the selected block detects errors;
   and updating a link table of the flash memory.

2. The method as claimed in claim 1, further comprising saving an error type information when detecting errors in the last page, wherein the error type information comprises a physical address of the selected block and a number of the last page.

3. The method as claimed in claim 2, wherein the steps of moving and updating are executed after all the blocks are checked whether the blocks contain errors.

4. The method as claimed in claim 1, further comprising: determining a type of the selected block; and if the type of the selected block is not a first type, the selected block is marked as a spare block.

5. The method as claimed in claim 4, wherein the first type comprises a FAT block, a Mother block, a Data block, a Child block, an Erase info block, a Link block and a Temp block.

6. The method as claimed in claim 4, wherein the step of determining is implemented by reading data in a spare region of the selected block.

7. The method as claimed in claim 1, wherein the step of checking comprises:
reading data respectively stored in a data region and a spare region of the last page;
verifying the data stored in the data region of the last page based on the data stored in the spare region of the last page; and
determining whether the last page contains errors based on the verification result.

8. The method as claimed in claim 1, wherein the step of updating comprises:
reading and modifying the link table which is pre-loaded in a volatile memory; and
loading the modified link table to the flash memory.

9. A link table recovery method for a flash memory comprising a plurality of blocks after sudden power failure, comprising:
selecting a last accessed block;
checking pages of the last accessed block to determine whether the last accessed block has errors;
moving correct data from the last accessed block to a spare block when detecting error in a first page;
moving remaining data from a mother block corresponding to a child block to the spare block when the last accessed block is the child block;
and updating a link table of the flash memory.

10. The method as claimed in claim 9, wherein the correct data is the data stored in the pages previous to the first page of the last accessed block.

11. The method as claimed in claim 9, further comprising:
erasing the mother block and the last accessed block; and
marking the mother block and the last accessed block as a spare block type, wherein the step of updating the link table is executed after marking the mother block and the last accessed block as a spare block type.

12. The method as claimed in claim 9, wherein the step of checking comprises:
reading data respectively stored in a data region and a spare region of each page of the last accessed block;
verifying the data stored in the data region of the page based on the data stored in the spare region of the page; and
determining whether the page contains errors based on the verification result.

13. The method as claimed in claim 9, wherein the step of updating comprises:
reading and modifying the link table which is pre-loaded in a volatile memory; and
loading the modified link table to the flash memory.

14. A link table recovery method for a flash memory comprising a plurality of blocks after sudden power failure, comprising:
selecting a last accessed block;
checking pages of the last accessed block to determine whether the last accessed block has errors;
moving correct data from the last accessed block to a spare block when detecting error in a first page;
saving an error type information when detecting errors in the last page, wherein the error type information comprises a physical address of the selected block and a number of the last page;
and updating a link table of the flash memory.

15. The method as claimed in claim 14, wherein the correct data is the data stored in the pages previous to the first page of the last accessed block.

16. The method as claimed in claim 14, further comprising:
erasing a mother block and the last accessed block; and
marking the mother block and the last accessed block as a spare block type, wherein the step of updating the link table is executed after marking the mother block and the last accessed block as a spare block type.

17. The method as claimed in claim 14, wherein the step of checking comprises:
reading data respectively stored in a data region and a spare region of each page of the last accessed block;
verifying the data stored in the data region of the page based on the data stored in the spare region of the page; and
determining whether the page contains errors based on the verification result.

18. The method as claimed in claim 14, wherein the step of updating comprises:
reading and modifying the link table which is pre-loaded in a volatile memory; and
loading the modified link table to the flash memory.

* * * * *